US012793617B2

(12) United States Patent
Kim et al.

(10) Patent No.: US 12,793,617 B2
(45) Date of Patent: Nov. 10, 2026

(54) LED DISPLAY DRIVING DEVICE

(71) Applicant: LX Semicon Co., Ltd., Daejeon (KR)

(72) Inventors: Ji Hwan Kim, Daejeon (KR); Jeongwoo Lee, Daejeon (KR); Jaemin Kim, Daejeon (KR); Jin Ho Choi, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 6 days.

(21) Appl. No.: 19/080,556

(22) Filed: Mar. 14, 2025

(65) Prior Publication Data

US 2025/0292724 A1 Sep. 18, 2025

(30) Foreign Application Priority Data

Mar. 18, 2024 (KR) ........................ 10-2024-0037399
Feb. 28, 2025 (KR) ........................ 10-2025-0026392

(51) Int. Cl.
*G09G 3/32* (2016.01)
*G09F 9/302* (2006.01)
*H10W 90/00* (2026.01)

(52) U.S. Cl.
CPC ............. *G09G 3/32* (2013.01); *G09F 9/3026* (2013.01); *G09G 2300/026* (2013.01); *G09G 2300/043* (2013.01); *G09G 2310/08* (2013.01); *G09G 2320/064* (2013.01); *G09G 2330/023* (2013.01); *G09G 2330/027* (2013.01); *G09G 2360/04* (2013.01); *H10W 90/00* (2026.01)

(58) Field of Classification Search
CPC ............... G09G 3/32; G09G 2300/043; G09G 2310/08; G09G 2320/064; G09G 2330/023; G09G 2330/027; G09G 2360/04; G09G 2300/026; G09F 9/3026; H01L 25/0753
See application file for complete search history.

(56) References Cited

U.S. PATENT DOCUMENTS

2017/0263204 A1* 9/2017 Tanaka ................. G09G 3/3677
2020/0135153 A1* 4/2020 Ogawa ................... G09G 3/006

* cited by examiner

*Primary Examiner* — Adam R. Giesy
(74) *Attorney, Agent, or Firm* — Birch, Stewart, Kolasch & Birch, LLP

(57) ABSTRACT

An LED display driving device can include a master driver IC and a slave driver IC configured to drive LEDs arranged in each of display areas included in a display panel. The display area can include display units. The master driver IC drives a first scan line group corresponding to first and second display units adjacent to each other in a first direction among the display units and a first channel line group corresponding to first and third display units adjacent to each other in a second direction perpendicular to the first direction. Further, the slave driver IC drives a second scan line group corresponding to third and fourth display units adjacent to each other in the first direction among the display units and a second channel line group corresponding to second and fourth display units adjacent to each other in the second direction.

20 Claims, 9 Drawing Sheets

103: 103a, 103b, 103c, 103d

114: 114a, 114b

LED DISPLAY DRIVING DEVICE

CROSS-REFERENCE TO RELATED APPLICATIONS

This application claims priority to Korean Patent Application No. 10-2024-0037399 filed on Mar. 18, 2024 in the Republic of Korea, and Korean Patent Application No. 10-2025-0026392 filed on Feb. 28, 2025 in the Republic of Korea, the entire contents of all these applications being hereby expressly incorporated by reference into the present application.

BACKGROUND

Field of the Invention

The present disclosure relates to a light emitting diode (LED) display driving device with reduced power consumption.

Description of the Related Art

A display device can be implemented in various ways. For example, the display device can be classified into a liquid crystal display (LCD) device or an LED display device.

A mini-LED or micro-LED elements can be used in the LED display device. Accordingly, the number of modularized LED elements can be disposed as necessary. As a result, a large-scaled display device such as Signage can be easily implemented.

However, as a plurality of LED modules are included in the display device, the number of required driver ICs can be also large. Accordingly, it is important to reduce power consumption of each driver IC.

In addition, as each country's power consumption regulations are strengthening, the need for a method for reducing power consumption of a display device is emerging.

SUMMARY OF THE DISCLOSURE

The present disclosure has been made in view of the above problems and it is an object of the present disclosure to provide an LED display driving device with reduced power consumption.

It is another object of the present disclosure to provide an LED display driving device with reduced leakage current.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of an LED display driving device comprising a master driver integrated circuit (IC) and a slave driver IC for driving a plurality of LEDs arranged in each of a plurality of display areas included in a display panel, wherein the display area includes a plurality of display units, the master driver IC drives a first scan line group corresponding to first and second display units adjacent to each other in a first direction among the plurality of display units and a first channel line group corresponding to first and third display units adjacent to each other in a second direction perpendicular to the first direction, and the slave driver IC drives a second scan line group corresponding to third and fourth display units adjacent to each other in the first direction among the plurality of display units and a second channel line group corresponding to second and fourth display units adjacent to each other in the second direction.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
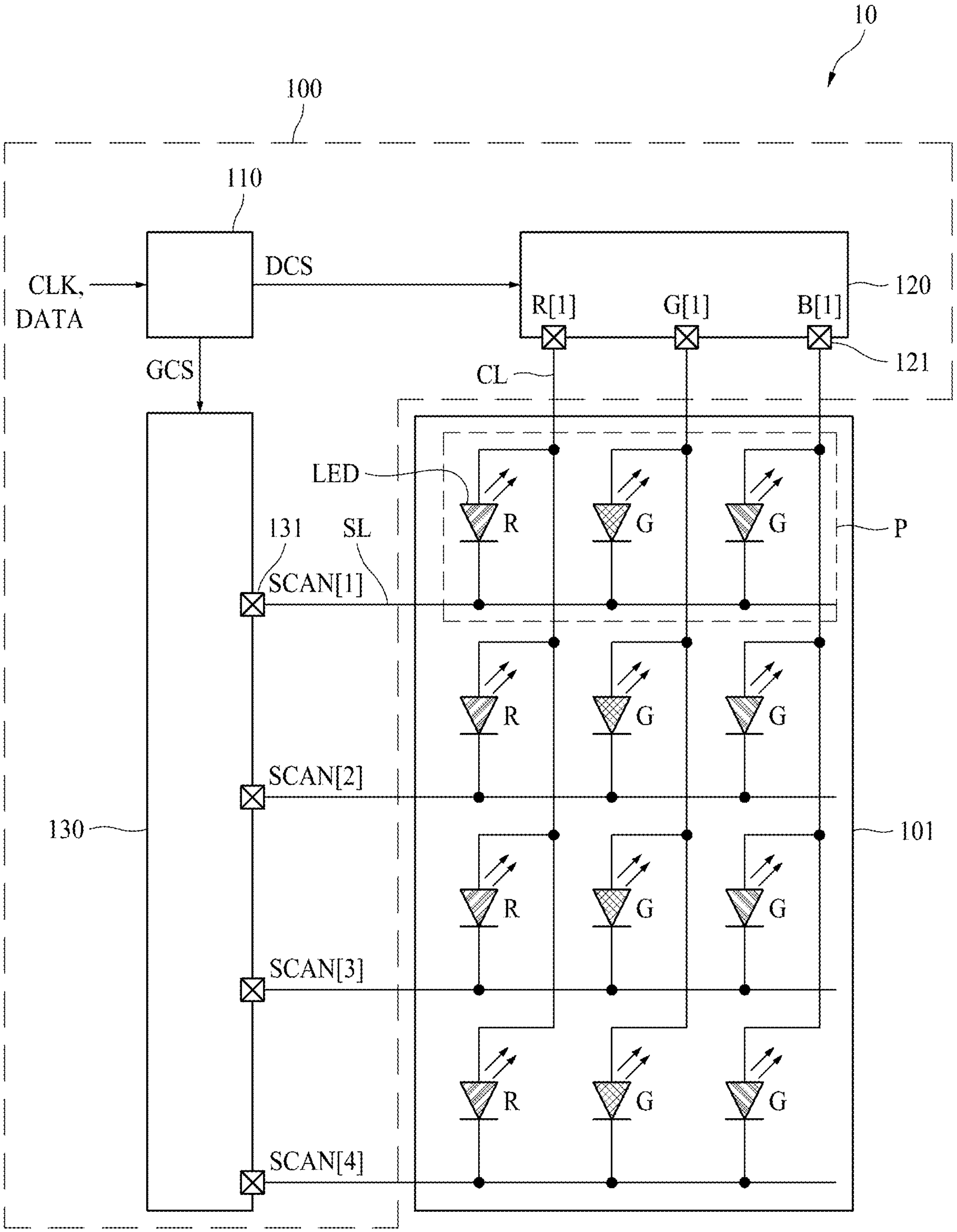
FIG. 1 is a view illustrating a configuration of an LED display device according to an embodiment of the present disclosure.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have' and 'include' described in the present disclosure are used, another portion can be added unless 'only' is used. The terms of a singular form can include plural forms unless referred to the contrary.

In construing an element, the element is construed as including an error band although there is no explicit description.

In describing a position relationship, for example, when the position relationship is described as 'upon', 'above', 'below' and 'next to', one or more portions can be disposed between two other portions unless 'just' or 'direct' is used.

In describing a position relationship, for example, when the position relationship is described as 'upon', 'above', 'below', and 'next to', one or more portions can be arranged between two other portions unless 'just' or 'direct' is used. Spatially relative terms such as "below", "beneath", "lower", "above", and "upper" can be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device can be arranged "above" another device. Therefore, an example term "below or beneath" can include "below or beneath" and "above" orientations. Likewise, an example term "above" or "on" can include "above" and "below or beneath" orientations.

In describing a temporal relationship, for example, when the temporal order is described as "after," "subsequent," "next," and "before," a case which is not continuous can be included, unless "just" or "direct" is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" can include all combinations of two or more elements selected from the first, second and third elements as well as each element of the first, second and third elements. Further, the term "can" fully encompasses all the meanings and coverages of the term "may" and vice versa.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

In adding reference numerals to elements of each drawing describing embodiments of the present disclosure, the same elements can have the same reference numerals as possible even though they are shown on different drawings.

FIG. 1 is a view illustrating a configuration of an LED display device 10 according to an embodiment of the present disclosure.

According to an embodiment of the present disclosure, the LED display device 10 can include a display panel 101 and an LED display driving device 100. In detail, the LED display driving device 100 can include a display controller 110, a data driver 120, and a gate driver 130. The LED display device 10 can further include a power supply circuit. The display panel 101, the display controller 110, the data driver 120, and the gate driver 130 will be described in detail below. The LED display driving device 100 is configured to supply a channel current to the plurality of LEDs and allow the plurality of LEDs to emit light.

According to an embodiment of the present disclosure, the display panel 101 performs a display function, and can be implemented as an LED display. The display panel 101 of the present disclosure can also perform a touch sensing function.

According to an embodiment of the present disclosure, the display panel 101 can include a plurality of scan lines SL, a plurality of channel lines CL, and a plurality of pixels P.

According to an embodiment of the present disclosure, each of the plurality of pixels P can include a plurality of subpixels R, G and B. For example, the pixel P can include a subpixel R representing red, a subpixel G representing green, and a subpixel B representing blue. However, the type of subpixel included in the pixel P is not limited to the above example and can vary depending on embodiments.

According to an embodiment of the present disclosure, each of the subpixels R, G and B can include an LED. For example, the display panel 101 can be an LED display panel.

The plurality of pixels P can be connected to each other in a horizontal direction through a scan line SL. Further, the plurality of pixels P can be connected to each other in a vertical direction through the channel line CL. The scan line SL and the channel line CL are positioned to cross each other, thereby defining subpixels R, G and B. Accordingly, the plurality of pixels P can be disposed to form a matrix. The display panel 101 includes a plurality of LEDs disposed in a plurality of subpixels R, G, and B where a plurality of channel line CL and a plurality of scan line SL intersect.

The plurality of pixels P can include a thin film transistor connected to the scan line SL and the channel line CL, which are adjacent thereto, a pixel electrode connected to the thin film transistor, and a storage capacitor connected to the pixel electrode.

According to an embodiment of the present disclosure, the display controller 110 receives various signals from an external system and generates a data control signal DCS to drive the data driver 120 and generates a gate control signal GCS to drive the gate driver 130. Further, the display controller 110 can receive a vertical synchronization signal Vsync from the external system.

The display controller 110 can control the data driver 120 and the gate driver 130.

The display controller 110 aligns image data RGB received from the external system. In detail, the display controller 110 aligns image data RGB' to conform to a structure and characteristics of the display panel 101. The display controller 110 transfers the aligned image data RGB' to the data driver 120.

The data control signal DCS can include a source start pulse SSP, a source sampling clock SSC, a source output enable signal SOE, a PWM (pulse width modulation) signal $T_{PWM\_R1}$, a channel off signal $T_{OFF\_R1}$, and the like, and the gate control signal GCS can include a gate start pulse GSP, a gate shift clock GSC, a gate output enable signal, and a scan signal $T_{SCAN\_ON1}$.

According to an embodiment of the present disclosure, the data driver 120 converts the aligned image data RGB' into a data signal in accordance with a timing signal generated by the display controller 110. In detail, the data driver 120 converts the aligned image data RGB' into the data signal in accordance with a source start pulse, a source sampling clock, and a source output enable signal. The data driver 120 outputs the data signal for one horizontal line to a data line every one horizontal period in which a scan signal is supplied to the scan line SL. In this case, the data driver 120 receives a gamma voltage from a gamma voltage generator, and can convert the aligned image data RGB' into the data signal by using the gamma voltage.

According to an embodiment of the present disclosure, the data driver 120 can include a plurality of channel stages 121.

The plurality of channel stages 121 can include a first red channel stage R[1], a first green channel stage G[1], and a first blue channel stage B[1]. Although only the first red channel stage R[1], the first green channel stage G[1], and the first blue channel stage B[1] are illustrated in FIG. 1, the plurality of channel stages 121 can include more channel stages.

The plurality of channel stages 121 can supply LED power source to the display panel 101 through the plurality of channel lines CL based on the data signal.

Each of the plurality of channel stages 121 can be connected to an LED of the display panel 101 through one channel line CL. Each of the plurality of channel stages 121 can be sequentially connected to the display panel 101 in the horizontal direction through one channel line CL.

According to an embodiment of the present disclosure, the gate driver 130 outputs the scan signal synchronized with the data signals generated by the data driver 120 to the scan line SL in accordance with the timing signal generated by the display controller 110. In detail, the gate driver 130 outputs the scan signal synchronized with the data signals to the scan line SL in accordance with the gate start pulse, the gate shift clock, and the gate output enable signal by the display controller 110.

The gate driver 130 can include a gate shift register circuit, a gate level shifter circuit, and the like.

According to an embodiment of the present disclosure, the gate driver 130 can include a plurality of output stages 131.

The plurality of output stages 131 can include a first output stage SCAN[1], a second output stage SCAN[12], a third output stage SCAN[3], and a fourth output stage SCAN[4]. Although only the first output stage SCAN[1], the second output stage SCAN[12], the third output stage SCAN [3] and the fourth output stage SCAN[4] are illustrated in FIG. 1, the plurality of output stages 131 can include more output stages.

The plurality of output stages 131 can supply a driving power source to the display panel 101 through a plurality of scan lines SL based on the scan signal.

Each of the plurality of output stages 131 can be connected to the LED of the display panel 101 through a single scan line SL. Each of the plurality of output stages 131 can be sequentially connected to the display panel 101 in the vertical direction through a single scan line SL.

The power supply circuit generates various signals required by the data driver 120 and the gate driver 130. For example, the power supply circuit generates an analog power source and a digital power source by boosting or stepping down a system voltage.

Figure 2:
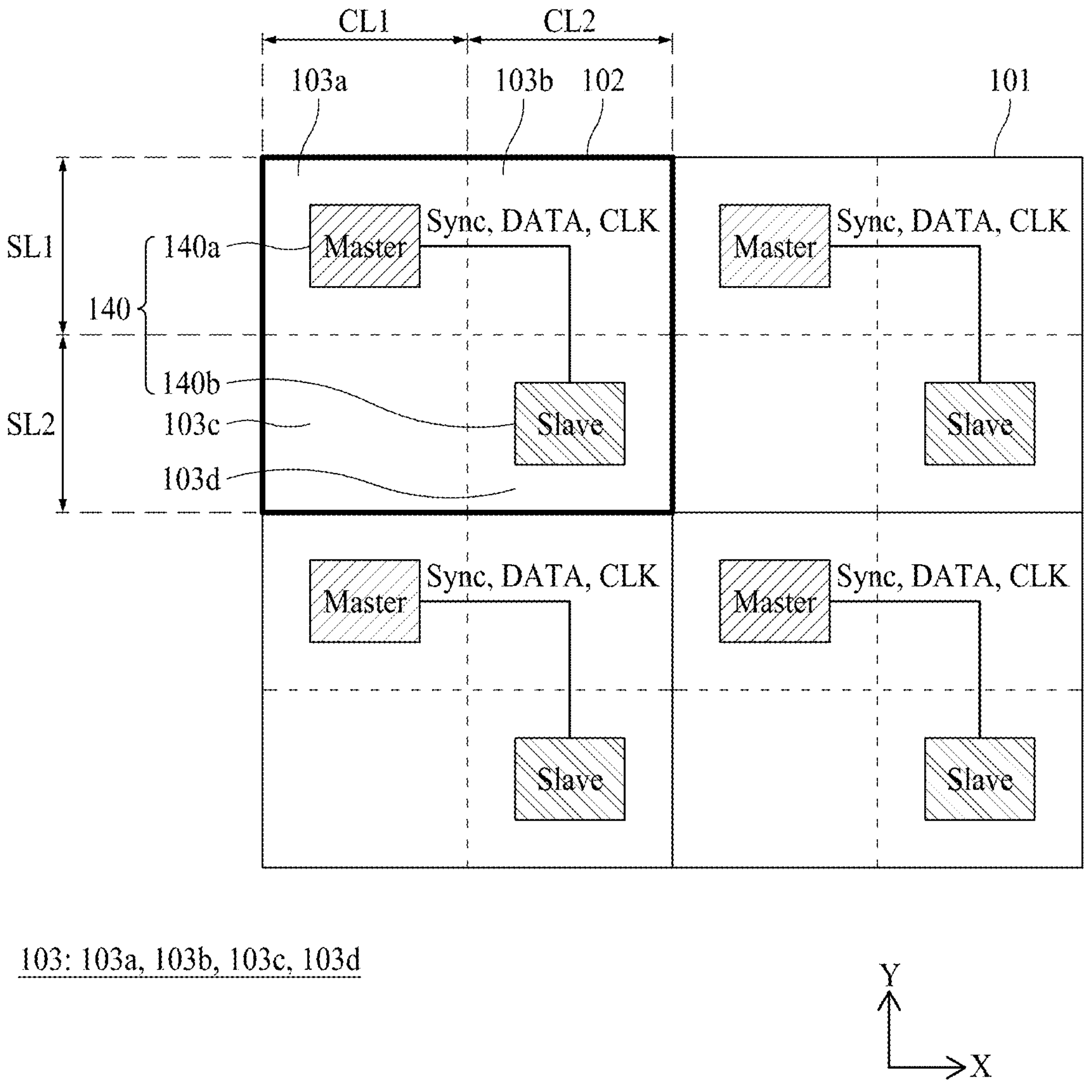
FIG. 2 is a view illustrating a partial area of a display panel according to an embodiment of the present disclosure.

FIG. 2 is a view illustrating a partial area of a display panel 101 according to an embodiment of the present disclosure.

According to an embodiment of the present disclosure, the display panel 101 can include a plurality of display areas 102. Referring to FIG. 2, the plurality of display areas 102 are arranged in a matrix form to constitute one display panel 101. The LED display device 10 of the present disclosure can be implemented as a single large display device such as a digital signage and an electronic display, to which the plurality of display areas 102 are coupled or assembled, or a single small display device such as a monitor for a personal computer or a TV, but the present disclosure is not limited thereto.

FIG. 2 shows four display areas 102 constituting the display panel 101, but various numbers of display areas 102 can be coupled to each other to implement the display panel 101.

According to an embodiment of the present disclosure, the display area 102 can include a plurality of display units 103. The plurality of display units 103 can include M+1 (where M is a natural number greater than or equal to 1) rows and M+1 columns.

FIG. 2 shows four display units 103 constituting the display area 102, but nine display units 103 can be arranged in a matrix form of 3×3.

In detail, the first display unit 103*a*, the second display unit 103*b*, the third display unit 103*c*, and the fourth display unit 103*d* are arranged in FIG. 2. In more detail, in the first direction X, the first display unit 103*a* and the second display unit 103*b* are arranged to be adjacent to each other, and the third display unit 103*c* and the fourth display unit 103*d* are arranged to be adjacent to each other. Furthermore, in the second direction Y, the first display unit 103*a* and the third display unit 103*c* are arranged to be adjacent to each other, and the second display unit 103*b* and the fourth display unit 103*d* are arranged to be adjacent to each other.

According to an embodiment of the present disclosure, the LED display driving device 100 can include a driver IC 140. In detail, the driver IC 140 can include a master driver IC 140*a* and a slave driver IC 140*b*. The master driver IC 140*a* can output a synchronization signal Sync to the slave driver IC 140*b*.

The master driver IC 140*a* can drive a first scan line group SL1 corresponding to the first and second display units 103*a* and 103*b* adjacent to each other in the first direction X among the plurality of display units 103 and a first channel line group CL1 corresponding to the first and third display units 103*a* and 103*c* adjacent to each other in the second direction Y.

The slave driver IC 140*b* can drive a second scan line group SL2 corresponding to the third and fourth display units 103*c* and 103*d* adjacent to each other in the first direction X among the plurality of display units 103 and a second channel line group CL2 corresponding to the second and fourth display units 103*b* and 103*d* adjacent to each other in the second direction Y.

According to an embodiment of the present disclosure, the LED display driving device 100 can include one master driver IC 140*a* and M slave driver ICs 140*b* for each display area 102. In detail, when the display area 102 includes a display unit 103 of M+1 rows and M+1 columns, the LED display driving device 100 can include M+1 driver ICs 140. In this case, among the M+1 driver ICs 140, the number of the master driver IC 140*a* is one and the number of the slave driver ICs 140*b* is M.

According to an embodiment of the present disclosure, the master driver IC 140*a* can be disposed in a column 1 of a row 1, and the slave driver IC 140*b* can be disposed in a column N (a natural number greater than 1 and less than or equal to M+1) of a row N. Referring to FIG. 2, the master driver IC 140*a* and the slave driver IC 140*b* can be disposed in parallel in a diagonal direction based on rows and columns, and the arrangement structure of the master driver IC 140*a* and the slave driver IC 140*b* of the present disclosure is not limited thereto.

The configuration of the master driver IC 140*a* and the slave driver IC 140*b* will be described in detail in FIGS. 3 and 4.

Figure 3:
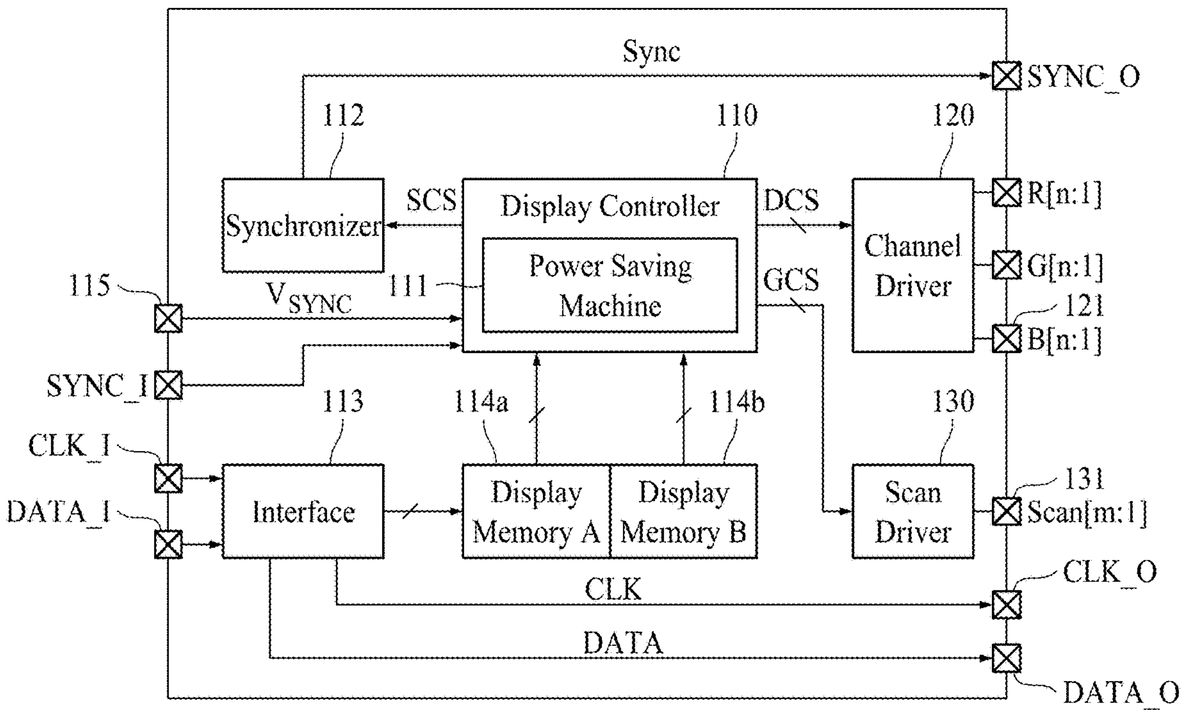
FIG. 3 is a view illustrating a configuration of a driver IC according to an embodiment of the present disclosure.

FIG. 3 is a view illustrating a configuration of a driver IC 140 according to an embodiment of the present disclosure. FIG. 4 is a view illustrating a portion of an LED display driving device 100 according to an embodiment of the present disclosure.

The configurations of the master driver IC 140*a* and the slave driver IC 140*b* are the same as those of the driver IC 140 shown in FIG. 3. The following description of the driver IC 140 corresponds to the description of the master driver IC 140*a* and the slave driver IC 140*b*.

According to an embodiment of the present disclosure, the driver IC 140 can include a data driver 120, a gate driver 130, and a display controller 110. The data driver 120, the gate driver 130, and the display controller 110 of the driver IC 140 can correspond to the data driver 120, the gate driver 130, and the display controller 110, which are described in FIG. 1, respectively.

According to an embodiment of the present disclosure, the driver IC 140 can include an interface 113, a data storage unit 114, a power reduction determination unit 111, a synchronization unit 112, a Vsync input terminal 115, a synchronization signal input terminal Sync_I, a synchronization signal output terminal Sync_O, a data input terminal DATA_I, a clock input terminal CLK_I, a data output stage DATA_O, and a clock output terminal CLK_O.

The interface 113 can input frame data input from the outside. In detail, the interface 113 can serve to transfer the frame data input from the outside to the data storage unit 114. In detail, data DATA and clock CLK can be output from the data input terminal DATA_I and the clock input terminal CLK_I to the data output terminal DATA_O and the clock output terminal CLK_O after passing through the interface 113. In more detail, the data DATA and the clock CLK can be transferred from the interface 113 provided in the master driver IC 140*a* to the interface 113 provided in the slave driver IC 140*b* after passing through the data output stage DATA_O and the clock output terminal CLK_O.

The data input from the outside can include the data DATA transferred through the data input terminal DATA_I and the clock CLK transferred through the clock input terminal CLK_I.

The data storage unit 114 can serve to store frame data provided from the interface 113. The data storage unit 114 can include a first data storage unit 114*a* and a second data storage unit 114*b*.

The first data storage unit 114*a* and the second data storage unit 114*b* can store frame data sequentially. For example, after the first data storage unit 114*a* stores the frame data transferred first, the second data storage unit 114*b* can store the frame data transferred secondly. Although only the first data storage unit 114*a* and the second data storage unit 114*b* are illustrated in FIG. 3, the present disclosure is not limited thereto and can include three or more data storage units.

The data storage unit 114 can transfer the stored frame data to the display controller 110.

The description of the display controller 110 is repeated with the description of FIG. 1 and thus will be omitted.

According to an embodiment of the present disclosure, the display controller 110 can include a power reduction determination unit 111.

The power reduction determination unit 111 can serve to determine whether to operate a low power mode or a normal mode, which will be described below, through the frame data transferred from the data storage unit 114. In detail, the power reduction determination unit 111 provided in each of the master driver IC 140*a* and the slave driver IC 140*b* can determine whether to operate the data driver 120 and the gate driver 130 of each of the master driver IC 140*a* and the slave driver IC 140*b* in a low power mode or a normal mode.

In detail, since the data input from the outside is transferred to the respective power reduction determination units 111 after passing through the interface 113 of each of the master driver IC 140*a* and the slave driver IC 140*b*, the master driver IC 140*a* and the slave driver IC 140*b* can know data information from each other. Accordingly, the power reduction determination unit 111 of each of the master driver IC 140*a* and the slave driver IC 140*b* can determine whether to operate each of the data driver 120 and the gate driver IC 130 in a low power mode or a normal mode.

The synchronization unit 112 can output the synchronization signal Sync by a synchronizer control signal SCS output from the display controller 110.

The synchronization signal Sync can be output from the synchronization unit 112 of the master driver IC 140*a* and transferred to the display controller 110 of the slave driver IC 140*b* through the synchronization signal output terminal Sync_O and the synchronization signal input terminal Sync_I of the slave driver IC 140*b*.

Based on the synchronization signal Sync output from the master driver IC 140*a*, the scan signal of the master driver IC 140*a* can be synchronized with the scan signal of the slave driver IC 140*b*. In detail, the synchronization signal Sync output from the master driver IC 140*a* includes scan information corresponding to the master driver IC 140*a*. For example, the synchronization signal Sync transfers the scan information corresponding to the master driver IC 140*a* to the slave driver IC 140*b*, so that the slave driver IC 140*b* can determine whether to perform a scan operation.

Figure 4:
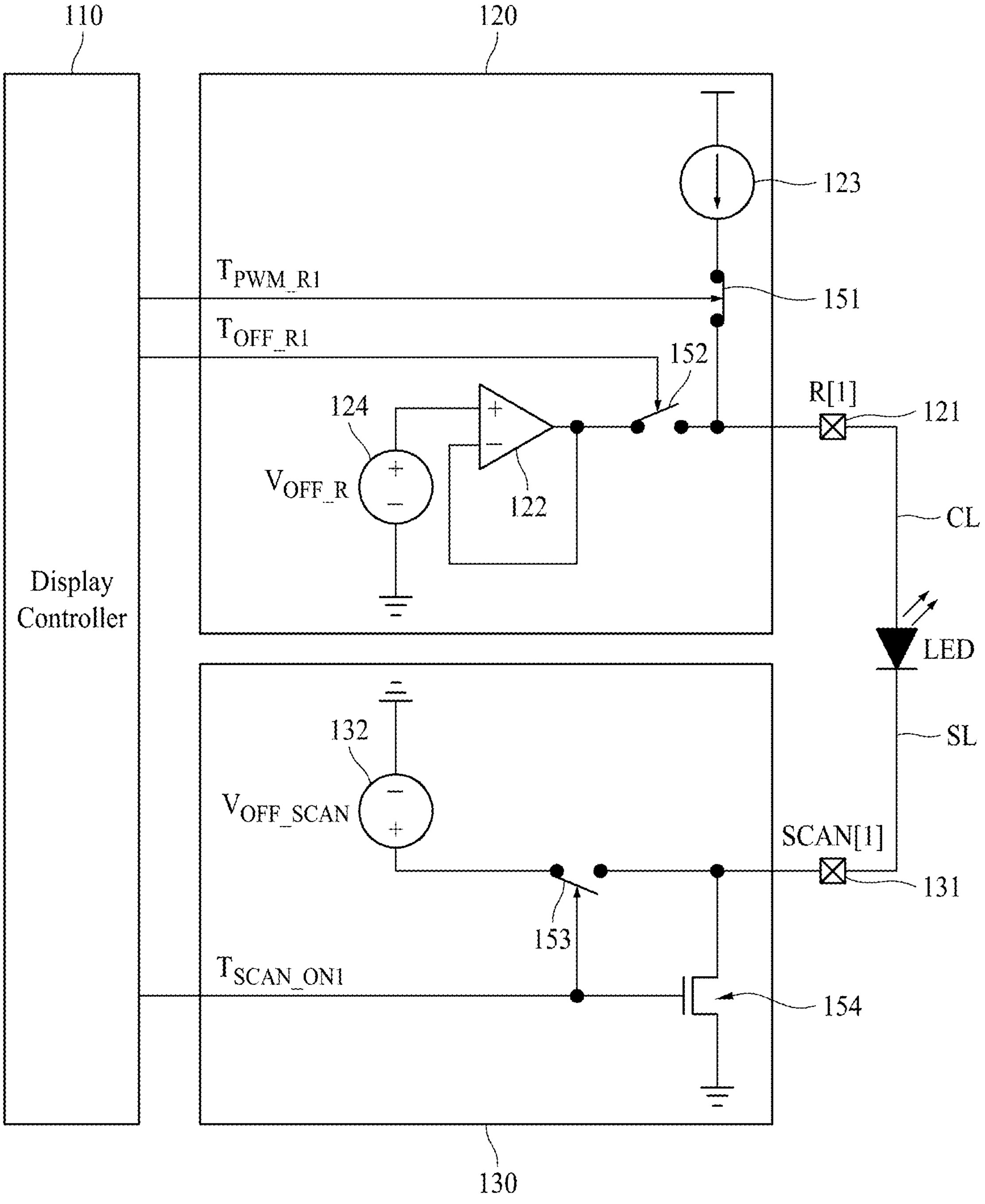
FIG. 4 is a view illustrating a portion of an LED display driving device according to an embodiment of the present disclosure.

FIG. 4 is a view showing a portion of a driver IC 140 according to an embodiment of the present disclosure. In detail, FIG. 4 is a view for explaining a principle that the driver IC 140 is driven in a low power mode or a normal mode.

Each of the master driver IC 140*a* and the slave driver IC 140*b* can be driven in a low power mode or a normal mode. In detail, the data driver 120 and the gate driver 130 of each of the master driver IC 140*a* and the slave driver IC 140*b* can be driven in a low power mode or a normal mode.

The components for driving each of the master driver IC 140*a* and the slave driver IC 140*b* in a low power mode or a normal mode will be described in detail below.

The data driver 120 can include a plurality of first switches 151 connecting the plurality of channel stages 121 to a plurality of channel current sources 123, respectively.

The plurality of first switches 151 can be turned on or turned off in accordance with the PWM signal $T_{PWM\_R1}$ transferred from the display controller 110.

The plurality of first switches 151 can be switches for controlling the following channel current. For example, the plurality of first switches 151 can be PWM switches. The amount of channel current supplied through each channel line CL can be determined depending on the time when the plurality of first switches 151 are turned on. Accordingly, brightness or color of the pixel P can be determined.

The plurality of channel current sources 123 can generate a channel current by using the LED power source. The channel current generated from each of the plurality of channel current sources 123 can be supplied to the pixel P connected in the vertical direction through one channel line CL.

The data driver 120 can include a plurality of second switches 152 connecting the plurality of channel stages 121 to a plurality of amplifiers (AMPs) 122, respectively.

The plurality of second switches 152 can be turned on or turned off in accordance with the channel off signal $T_{OFF\_R1}$ transferred from the display controller 110.

Each of the plurality of AMPs 122 can be connected to a channel-off voltage source 124 that supplies a channel-off voltage $V_{OFF\_R}$. The plurality of AMPs 122 can control an output voltage based on the channel-off voltage $V_{OFF\_R}$. In detail, the AMP 122 can amplify a difference between the channel-off voltage $V_{OFF\_R}$ output from the channel-off voltage source 124 and a voltage fed back from the output stage and output the amplified value to the output stage.

The gate driver 130 can include a plurality of third switches 153 connecting the plurality of output stages 131 to a plurality of scan offset voltage sources 132, respectively. In detail, the plurality of third switches 153 can be connected to a plurality of LEDs by the plurality of scan offset voltage sources 132.

The plurality of third switches 153 can be turned on or turned off in accordance with a scan signal $T_{SCAN\_ON1}$ transferred from the display controller 110.

Each of the plurality of third switches 153 can be connected to the scan offset voltage source 132 that supplies a scan-off voltage $V_{OFF\_SCAN}$.

The gate driver 130 can include a plurality of scan transistors 154 having one end connected to the plurality of output stages 131 and the other end grounded.

The plurality of scan transistors 154 can be turned on or turned off in accordance with a scan signal $T_{SCAN\_ON1}$ transferred from the display controller 110.

For example, when the data driver 120 is driven in the low power mode, it means that all switches corresponding to some or all of the plurality of channel stages 121 in the data driver 120 are turned off. For example, referring to FIG. 4, when the first switch 151 and the second switch 152, which correspond to the first red channel stage R[1], are turned off, the data driver 120 including the first red channel stage R[1] can be considered to be driven in the low power mode.

In addition, when the gate driver 130 is driven in the low power mode, it means that the third switch 153 corresponding to some or all of the plurality of output stages 131 in the gate driver 130 is maintained in a turn-on state, and the scan transistor 154 is maintained in a turn-off state. For example, referring to FIG. 4, when the third switch 153 corresponding to the first output stage SCAN[1] is maintained in a turn-on state and the scan transistor 154 is maintained in a turn-off state, the gate driver 130 including the first output stage SCAN[1] can be considered to be driven in the low power mode.

Figure 5:
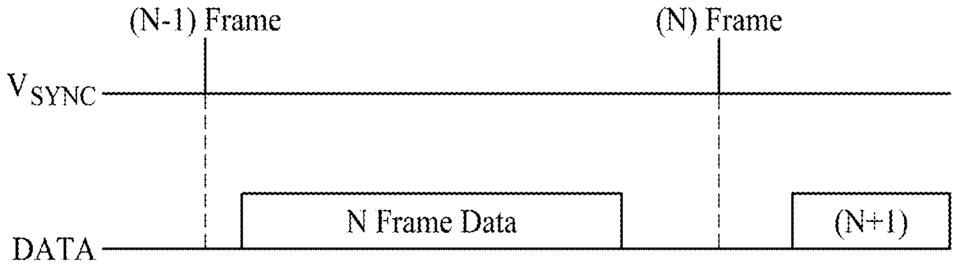
FIG. 5 is an operation timing view of an LED display driving device according to an embodiment of the present disclosure.

FIG. 5 is an operation timing view of an LED display driving device 100 according to an embodiment of the present disclosure.

In detail, FIG. 5 is a timing view illustrating a timing relationship between a vertical synchronization signal Vsync and a data signal DATA.

Frame data can mean each image constituting an image. One frame data can be composed of a plurality of segments.

One segment can be a unit in which a scan operation of one cycle is performed. The scan operation can be an operation performed as the third switch 153 included in the gate driver 130 is turned on and then turned off. The scan operation of one cycle can mean that the scan operation is sequentially performed once from the first output stage SCAN[1] to the last output stage SCAN[36]. Although the last output stage is shown as the 36th output stage in FIG. 6, the present disclosure is not limited thereto.

Referring to FIG. 5, after the vertical synchronization signal Vsync is activated, new frame data starts.

In detail, after transmission of (N)th frame data (N frame data) is completed, the vertical synchronization signal Vsync for the (N)th frame is activated. Further, after the vertical synchronization signal Vsync for the (N)th frame is activated, transmission of (N+1)th frame data starts.

According to an embodiment of the present disclosure, after transmission of the (N)th frame data (N frame data) is completed, as the vertical synchronization signal Vsync for the (N)th frame is activated, the power reduction determination unit 111 can determine whether the master driver IC 140*a* and the slave driver IC 140*b* operate in the low power mode or the normal mode. In detail, the power reduction determination unit 111 of each of the master driver IC 140*a* and the slave driver IC 140*b* can determine whether the master driver IC 140*a* and the slave driver IC 140*b* operate in the low power mode or the normal mode.

Figure 6:
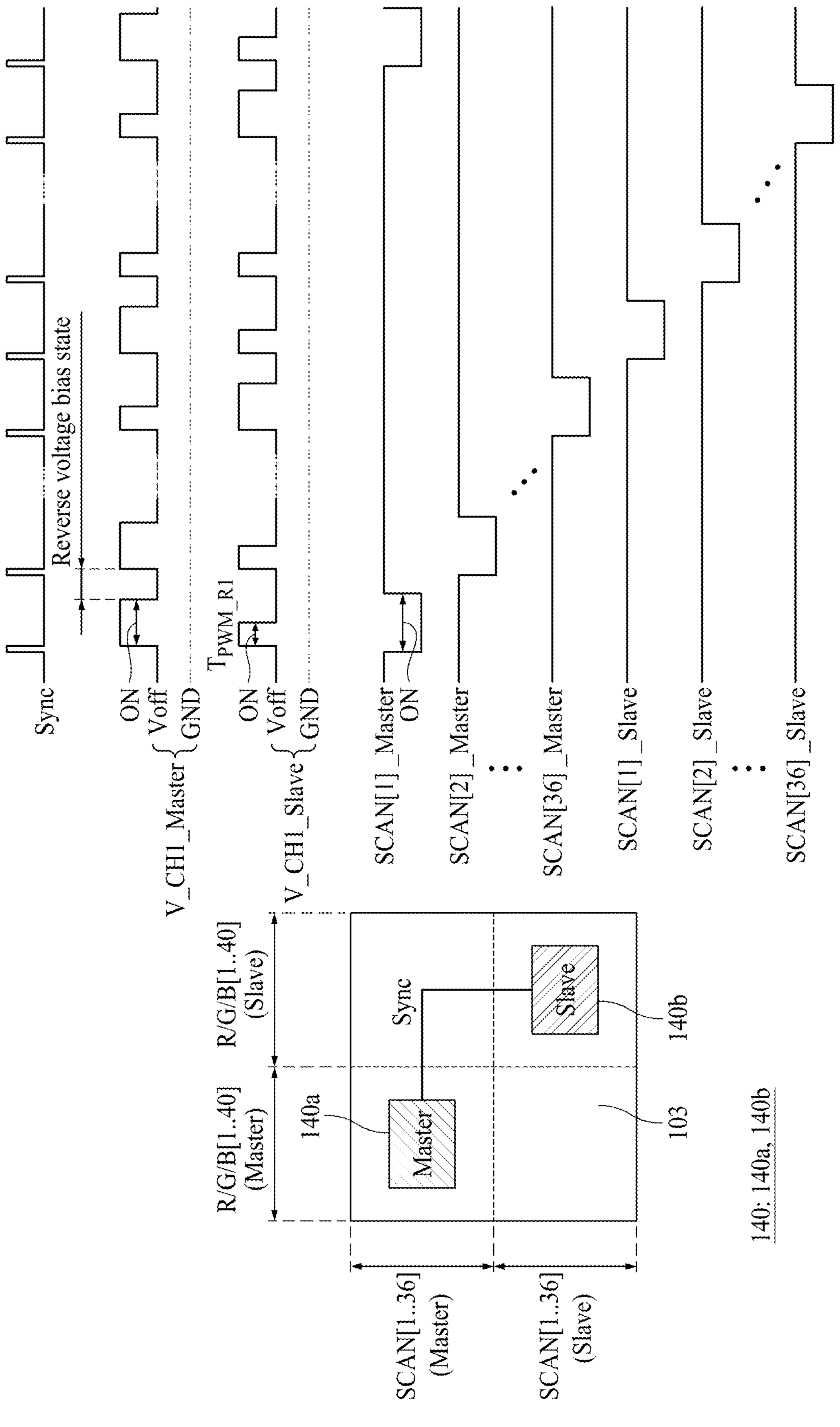
FIG. 6 is an operation timing view of an LED display driving device in a normal mode of the present disclosure.

FIG. 6 is an operation timing view of an LED display driving device 100 in a normal mode of the present disclosure.

FIG. 6 schematically shows a graph of a channel voltage V_CH1_Master applied to a first red channel stage R[1]_Master corresponding to the master driver IC 140*a* and a channel voltage V_CH1_Slave applied to a first red channel stage R[1]_Slave corresponding to the slave driver IC 140*b*.

In addition, a waveform of the scan signal $T_{SCAN\_ON1}$ for controlling the third switch 153 connected to each of the first to 36th output stages SCAN[1]_Master to SCAN[36]_Master corresponding to the master driver IC 140*a* and the first to 36th output stages SCAN[1]_Slave to SCAN[36]_Slave corresponding to the slave driver IC 140*b* is shown in FIG. 6.

According to an embodiment of the present disclosure, the first red channel stage G[1]_Master, the first green channel stage R[1]_Master and the first blue channel stage B[1]_Master to the 40th red channel stage R40]_Master, the 40th green channel stage G[40]_Master and the 40th blue channel stage B[40]_Master, which correspond to the master driver IC 140*a*, correspond to the first channel line group CL1, and the first to 36th output stages SCAN[1]_Master to SCAN[36]_Master correspond to the first scan line group SL1.

According to an embodiment of the present disclosure, the first red channel stage G[1]_Slave, the first green channel stage R[1]_Slave and the first blue channel stage B[1]_Slave to the 40th green channel stage G[40]_Slave, the 40th green channel stage G[40]_Slave and the 40th blue channel stage B[40]_Slave, which correspond to the slave driver IC 140*b*, correspond to the second channel line group CL2, and the first to 36th output stages SCAN[1]_Slave to SCAN[36]_Slave correspond to the second scan line group SL2.

Referring to FIG. 6, the graph of the channel voltages V_CH1_Master and V_CH1_Slave can include an ON period and an OFF period.

According to an embodiment of the present disclosure, the channel voltages V_CH1_Master and V_CH1_Slave can denote channel voltages applied to the corresponding channel lines CL when a channel current is supplied to the channel lines CL corresponding to the first red channel stages R[1]_Master and R[1]_Slave. In FIG. 6, channel voltages applied to channel lines corresponding to the other channel stages are omitted.

According to an embodiment of the present disclosure, in the ON period, the first switch 151 can be turned on, so that the channel current generated from the channel current source 123 can be supplied to the channel line CL. In the OFF period, the first switch 151 can be turned off, so that the channel current generated from the channel current source 123 can be blocked. The graph of the channel voltages V_CH1_Master and V_CH1_Slave can include an ON period and an OFF period, which are alternately arranged. The OFF period can be a period excluding a period corresponding to the ON period.

For example, the ON period of the graph of the channel voltages V_CH1_Master and V_CH1_Slave can mean the period in which the PWM signal $T_{PWM\_R1}$ is received, and the OFF period of the graph of the channel voltages V_CH1_Master and V_CH1_Slave can mean the period in which the PWM signal $T_{PWM\_R1}$ is not received. Further, in the ON period, when the PWM signal $T_{PWM\_R1}$ is turned on and thus the channel current is supplied to the channel line CL corresponding to the first red channel stages R[1]_Master and R[1]_Slave, the channel voltages V_CH1_Master and V_CH1_Slave applied to the corresponding channel line CL can increase from a reference voltage level Voff higher than the ground GND level. When the PWM signal $T_{PWM\_R1}$ is turned off and thus the supply of the channel current is stopped, the channel voltages V_CH1_Master and V_CH1_Slave can decrease again to the reference voltage level Voff.

According to an embodiment of the present disclosure, the reason why the channel voltages V_CH1_Master and V_CH1_Slave are maintained at the reference voltage level Voff higher than the ground GND level in the OFF period is to reduce the time taken for the channel voltages V_CH1_Master and V_CH1_Slave to increase to a maximum value in accordance with the supply of the channel current.

According to an embodiment of the present disclosure, the normal mode can include a display period and a non-display period. In this case, the display period means the ON period of the graph of the channel voltages V_CH1_Master and V_CH1_Slave, and the non-display period means the OFF period of the graph of the channel voltages V_CH1_Master and V_CH1_Slave.

According to an embodiment of the present disclosure, when the first switch 151 is turned off in the OFF period of the graph of the channel voltages V_CH1_Master and V_CH1_Slave, the second switch 152 can be turned on. In the OFF period, the first switch 151 is turned off and the second switch 152 is turned on, so that the channel-off voltage source 124 can generate the channel-off voltage $V_{OFF\_R}$.

In detail, in the normal mode, when the first switch 151 is turned off, the second switch 152 can be turned on, and when the first switch 151 is turned on, the second switch 152 can be turned off.

Referring to FIG. 6, a control period of the scan signal $T_{SCAN\_ON1}$ can include an ON period and an OFF period. In the ON period, the third switch 153 can be turned off, and the scan transistor 154 can be turned on, so that the scan signal can be supplied to the scan line SL. In the OFF period, the third switch 153 can be turned on, and the scan transistor 154 can be turned off, so that the scan offset voltage source 132 can supply the scan off voltage $V_{OFF\_SCAN}$. Accordingly, the scan offset voltage source 132 can output a precharge current to the output stage SCAN[1] after passing through the third switch 153. The OFF period can be a period excluding a period corresponding to the ON period.

In detail, in the normal mode, when the third switch 153 is turned off, the scan transistor 154 can be turned on, and when the third switch 153 is turned on, the scan transistor 154 can be turned off.

According to an embodiment of the present disclosure, in the display period, the plurality of first switches 151 included in the master driver IC 140*a* and the slave driver IC 140*b* can be turned on, the plurality of second switches 152 can be turned off, the plurality of third switches 153 can be turned off, and the scan transistor 154 can be turned on. Therefore, the LED can be turned on.

In detail, in the display period, the plurality of channel current sources 123 corresponding to the first channel line group CL1 and the second channel line group CL2 can supply the channel current to the corresponding channel line CL, and the plurality of scan transistors 154 corresponding to the first scan line group SL1 and the second scan line group SL2 can be turned on.

According to an embodiment of the present disclosure, the synchronization signal Sync is activated prior to the ON period of the graph of the channel voltages V_CH1_Master and V_CH1_Slave. In detail, the PWM signal $T_{PWM\_R1}$ can be input after the synchronization signal Sync is activated.

According to an embodiment of the present disclosure, the scan-off voltage $V_{OFF\_SCAN}$ can be greater than the channel-off voltage $V_{OFF\_R}$.

According to an embodiment of the present disclosure, when the first switch 151 is turned off and the scan transistor 154 is turned off in the non-display period, the period in which the second switch 152 is turned on and the third switch 153 is turned on can be referred to as a reverse voltage bias interval.

In detail, in the non-display period, the plurality of channel off voltage sources 124 corresponding to the first channel line group CL1 and the second channel line group CL2 can output the channel off voltage $V_{OFF\_R}$ to the corresponding channel line CL, and the plurality of scan offset voltage sources 132 corresponding to the first scan line group SL1 and the second scan line group SL2 can output the scan off voltage $V_{OFF\_SCAN}$ to the corresponding scan line SL.

The reverse voltage bias interval refers to a period in which the LED is maintained in a reverse voltage bias state due to a voltage difference between the channel-off voltage $V_{OFF\_R}$ and the scan-off voltage $V_{OFF\_SCAN}$. When the LED is maintained in the reverse voltage bias state, no current can flow to the LED. The LED display driving device 100 of the present disclosure can reduce a leakage current by maintaining the LED in the reverse voltage bias state for each non-display period in the normal mode.

Figure 7:
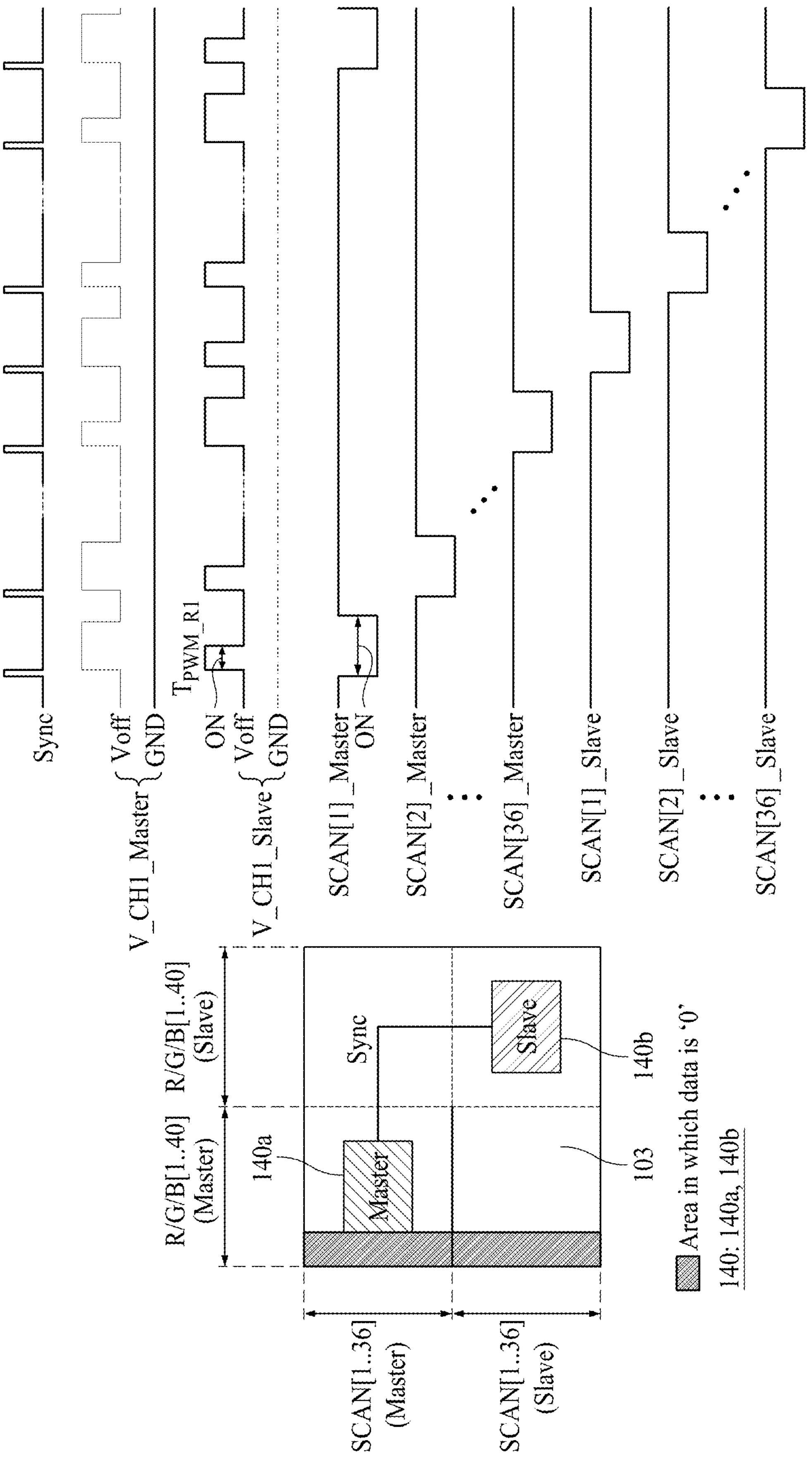
FIG. 7 is an operation timing view of an LED display driving device in a low power mode of the present disclosure.
Figure 8:
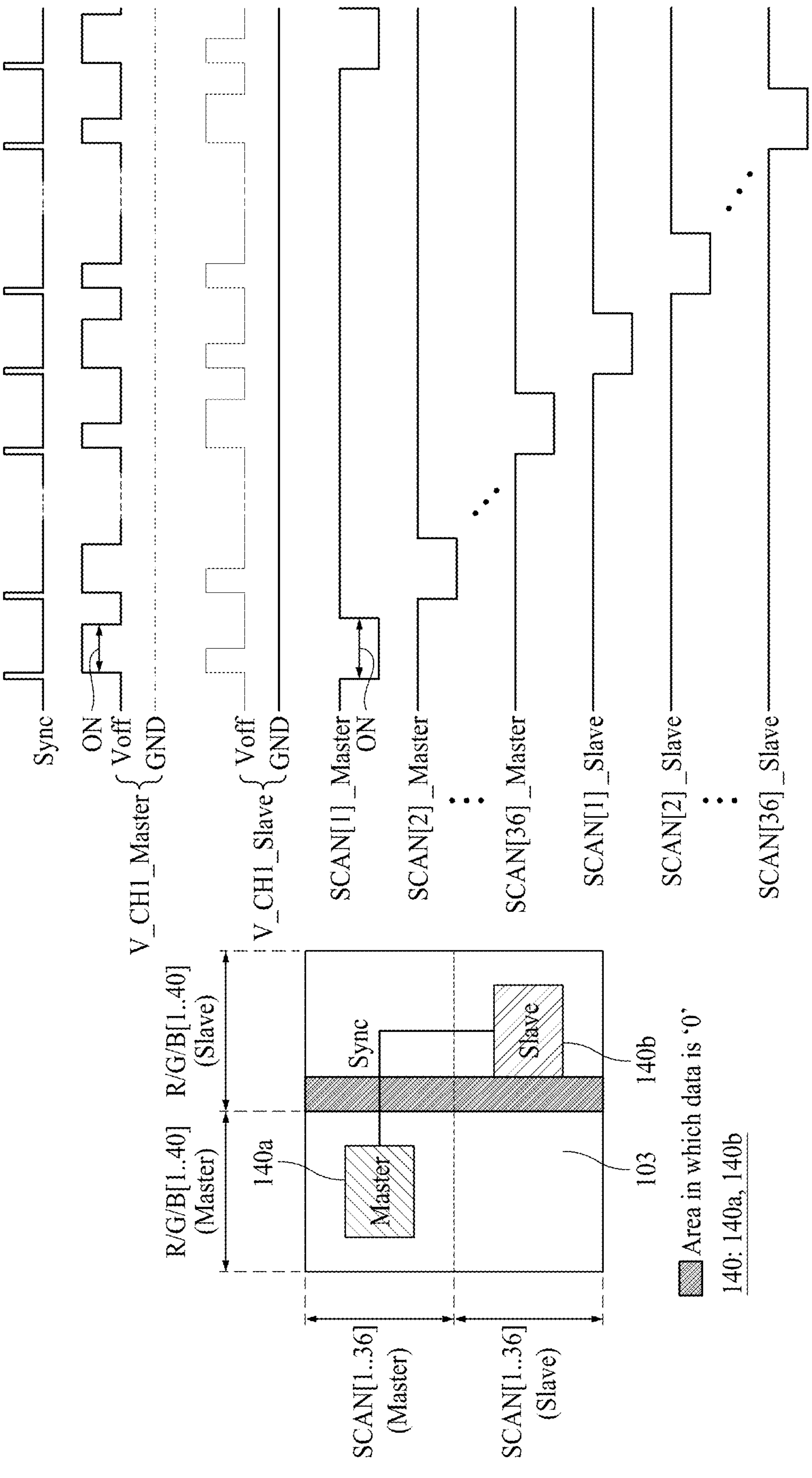
FIG. 8 is an operation timing view of an LED display driving device in another low power mode of the present disclosure.
Figure 9:
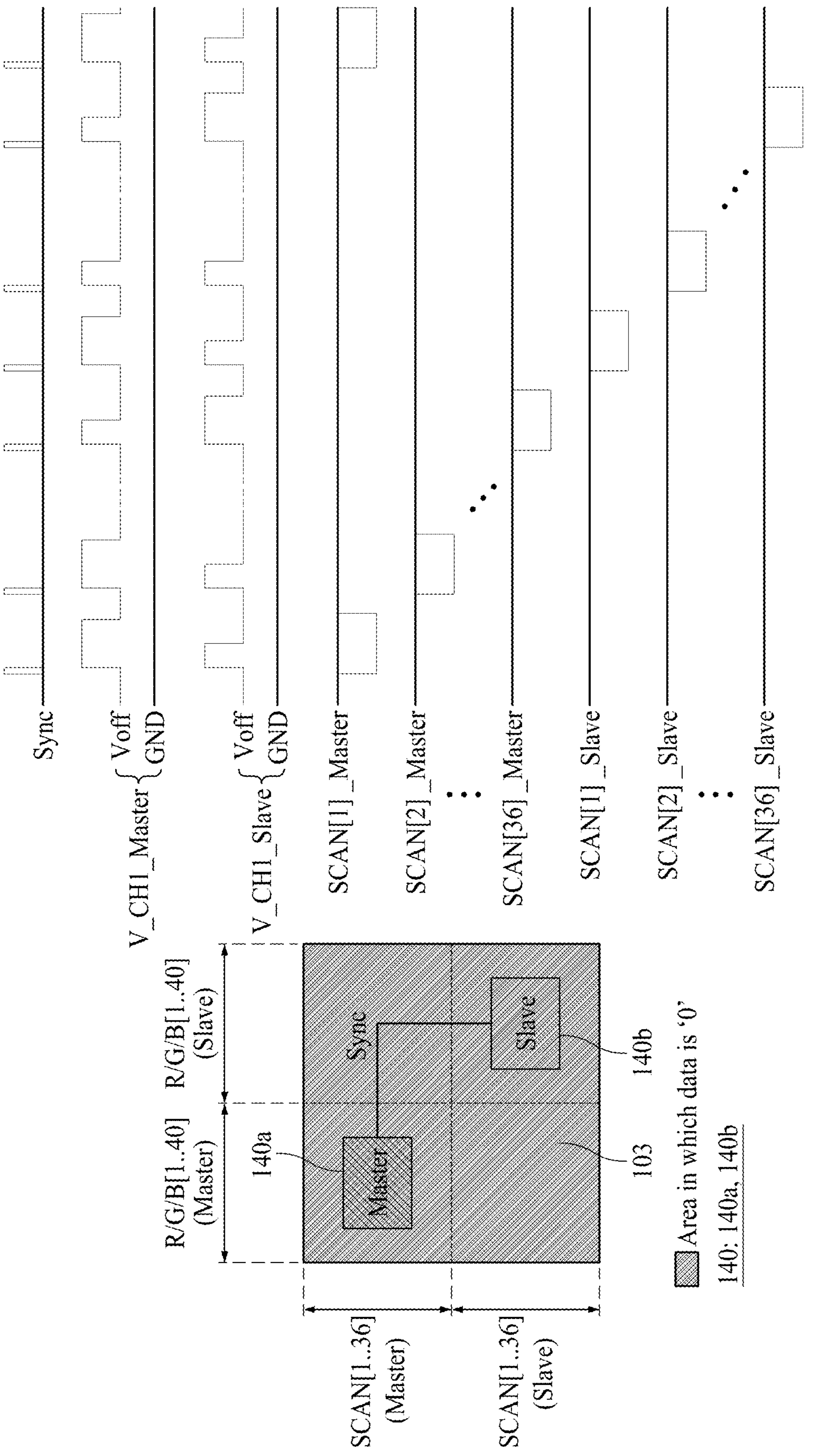
FIG. 9 is an operation timing view of an LED display driving device in other low power mode of the present disclosure.

FIG. 7 is an operation timing view of an LED display driving device 100 in a low power mode of the present disclosure. FIG. 8 is an operation timing view of an LED display driving device 100 in another low power mode of the present disclosure. FIG. 9 is an operation timing view of an LED display driving device 100 in other low power mode of the present disclosure.

In detail, left drawings of FIGS. 7 to 9 are views illustrating a partial area of the display panel 101 according to an embodiment of the present disclosure. The left drawings of FIGS. 7 to 9 show an area in which data is '0' in a portion of the display panel 101. In detail, the left drawings show that an area in which data is '0' exists in a plurality of display units 103. The fact that the data is '0' can mean that the first and second switches 151 and 152 of the channel stages 121 corresponding to the corresponding area are turned off. In detail, the plurality of channel current sources 123 and the plurality of AMPs 122 corresponding to the area in which data is '0' are blocked from the corresponding channel line CL.

According to an embodiment of the present disclosure, the data driver 120 and the gate driver 130 of each of the master driver IC 140*a* and the slave driver IC 140*b* can be driven in the low power mode or the normal mode.

For example, when the data driver 120 is driven in the low power mode, it means that all of the switches corresponding to some or all of the plurality of channel stages 121 in the data driver 120 are turned off. Furthermore, when the gate driver 130 is driven in the low power mode, it means that the third switch 153 corresponding to some or all of the plurality of output stages 131 in the gate driver 130 is maintained in a turn-on state, and the scan transistor 154 is maintained in a turn-off state.

According to an embodiment of the present disclosure, the normal mode of the data driver 120 means that the data driver 120 does not include the channel stage 121 in which all switches corresponding to any one channel stage 121 are turned off. In detail, the normal mode of the data driver 120 can mean that the area in which data is 0 does not exist in the display units 103 based on the second direction Y. Further, the normal mode of the gate driver 130 means that the third switch 153 corresponding to any one output stage 131 of the gate driver 130 is maintained in the turn-on state and the scan transistor 154 does not include the output stage 131 maintained in the turn-off state. In detail, the normal mode of the gate driver 130 can mean that the area in which data is 0 does not exist in the display units 103 based on the first direction X.

Referring to FIG. 7, when the first switch 151 and the second switch 152 corresponding to some of the plurality of channel stages 121 of the master driver IC 140*a* are turned off, the data driver 120 of the master driver IC 140*a* can be driven in the low power mode, the gate driver 130 of the master driver IC 140*a* can be driven in the normal mode, the data driver 120 of the slave driver IC 140*b* can be driven in the normal mode, and the gate driver 130 of the slave driver IC 140*b* can be driven in the normal mode.

For example, the first switch 151 and the second switch 152 of the channel stages 121 corresponding to the area in which data is 'O' in the data driver 120 of the master driver IC 140*a* are turned off. In this case, the channel voltage V_CH1_Master applied to the channel line CL corresponding to the area in which data is 'O' can be the ground GND level.

For example, when the area in which data is 'O' exists in the first display unit 103*a* and the third display unit 103*c* based on the second direction Y, the plurality of channel current sources 123 and the plurality of AMPs 122, which correspond to the area in which data is '0' in the first channel line group CL1, are blocked from the corresponding channel line CL, and the plurality of channel current sources 123 corresponding to the second channel line group CL2 supply a channel current to the corresponding channel line CL, and the plurality of scan transistors 154 corresponding to the first scan line group SL1 and the second scan line group SL2 can be turned on.

The description of the synchronization signal Sync shown in FIG. 7 is the same as the description of the synchronization signal Sync shown in FIG. 6.

In FIG. 7, for example, the first red channel stage R[1]_Master is the channel stage 121 corresponding to the area in which data is '0'.

Referring to FIG. 8, when the first switch 151 and the second switch 152 corresponding to some of the plurality of channel stages 121 of the slave driver IC 140*b* are turned off, the data driver 120 of the slave driver IC 140*b* can be driven in the low power mode, the gate driver 130 of the slave driver IC 140*b* can be driven in the normal mode, the data driver 120 of the master driver IC 140*a* can be driven in the normal mode, and the gate driver 130 of the master driver IC 140*a* can be driven in the normal mode.

For example, the first switch 151 and the second switch 152 of the channel stages 121 corresponding to the area in which data is '0' in the data drivers 120 of the slave driver IC 140*b* are turned off. In this case, the channel voltage V_CH1_Slave applied to the channel line CL corresponding to the area in which data is '0' can be the ground GND level.

For example, when the area in which data is '0' exists in the second display unit 103*b* and the fourth display unit 103*d* based on the second direction Y, the plurality of channel current sources 123 and the plurality of AMPs 122, which correspond to the area in which data is '0' in the second channel line group CL2, are blocked from the corresponding channel line CL, and the plurality of channel current sources 123 corresponding to the first channel line group CL1 supply a channel current to the corresponding channel line CL, and the plurality of scan transistors 154 corresponding to the first scan line group SL1 and the second scan line group SL2 can be turned on.

The description of the synchronization signal Sync shown in FIG. 8 is the same as the description of the synchronization signal Sync shown in FIGS. 6 and 7.

In FIG. 8, for example, the first red channel stage R[1]_Slave is the channel stage 121 corresponding to the area in which data is '0'.

Referring to FIG. 9, when the first switch 151 and the second switch 152 corresponding to all of the plurality of channel stages 121 of the master driver IC 140*a* and the plurality of channel stages 121 of the slave driver IC 140*b* are turned off, the data driver 120 of the mater driver IC 140*a* can be driven in the low power mode, the gate driver 130 of the master driver IC 140*a* can be driven in the low power mode, the data driver 120 of the slave driver IC 140*b* can be driven in the low power mode, and the gate driver 130 of the slave driver IC 140*b* can be driven in the low power mode.

For example, all switches in the data driver 120 of the master driver IC 140*a* and the slave driver IC 140*b* are turned off, the third switch 153 in the gate driver 130 is maintained in a turn-on state, and the scan transistor 154 is maintained in a turn-off state.

For example, when the first display unit 103*a*, the second display unit 103*b*, the third display unit 103*c*, and the fourth display unit 104*d* are all areas in which data is '0', the plurality of channel current sources 123 and the plurality of AMPs 122 of the first channel line group CL1 and the second channel line group CL2 are blocked from the corresponding channel line CL, and the plurality of scan offset voltage sources 132 corresponding to the first scan line group SL1 and the second scan line group SL2 can be connected to the plurality of LEDs corresponding thereto.

In this case, the channel voltages V_CH1_Master and V_CH1_Slave applied to the channel line CL corresponding to the area in which data is '0' can be the ground GND level.

Referring to FIG. 9, the synchronization signal Sync can be deactivated.

According to the present disclosure, the following advantageous effects can be obtained.

The LED display driving device according to an embodiment of the present disclosure can include a smaller number of driver ICs compared to the number of display units, thereby reducing power consumption.

The LED display driving device according to another embodiment of the present disclosure can drive each of the master driver IC and the slave driver IC in the low power mode, thereby reducing power consumption.

The LED display driving device according to other embodiment of the present disclosure can maintain the LED in the reverse bias state in the normal mode, thereby reducing the leakage current.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A light emitting diode (LED) display driving device comprising:

a master driver integrated circuit (IC) and a slave driver IC configured to drive a plurality of LEDs arranged in each of a plurality of display areas included in a display panel, wherein the display area includes a plurality of display units, wherein the master driver IC drives a first scan line group corresponding to a first display unit and a second display unit adjacent to each other in a first direction among the plurality of display units and a first channel line group corresponding to the first display unit and a third display unit adjacent to each other in a second direction perpendicular to the first direction, and wherein the slave driver IC drives a second scan line group corresponding to the third display unit and a fourth display unit adjacent to each other in the first direction among the plurality of display units and a second channel line group corresponding to the second display unit and the fourth display unit adjacent to each other in the second direction.

2. The LED display driving device of claim 1, wherein the master driver IC is disposed in an area corresponding to the first display unit, and wherein the slave driver IC is disposed in an area corresponding to the fourth display unit.

3. The LED display driving device of claim 1, wherein each of the master driver IC and the slave driver IC includes:

a data driver configured to output a data signal corresponding to image data to a plurality of LEDs connected to each channel line through a plurality of channel lines extended in the second direction;

a gate driver configured to select an LED to emit light among the plurality of LEDs by outputting a scan signal synchronized with the data signal to a plurality of scan lines extended in the first direction; and a display controller configured to control the data driver and the gate driver.

4. The LED display driving device of claim 3, wherein each of the master driver IC and the slave driver IC further includes a synchronization unit configured to output a synchronization signal by a synchronization control signal output from the display controller, and wherein the scan signal of the master driver IC is synchronized with the scan signal of the slave driver IC based on the synchronization signal output from the master driver IC.

5. The LED display driving device of claim 3, wherein each of the master driver IC and the slave driver IC further includes:

an interface; and a power reduction determination unit receiving data from each interface, wherein a data input from an outside is transferred to the interface of the slave driver IC through the interface of the master driver IC, and wherein the power reduction determination unit of each of the master driver IC and the slave driver IC determines whether to operate in a low power mode or a normal mode through the data received from each interface.

6. The LED display driving device of claim 3, wherein the data driver includes:

a plurality of channel current sources configured to supply a channel current to a corresponding channel line among the plurality of channel lines;

a plurality of channel-off voltage sources configured to output a channel-off voltage to a corresponding channel line among the plurality of channel lines; and a plurality of amplifiers configured to amplify a difference between the channel-off voltage output from the channel-off voltage source and a voltage fed back from an output stage and output the amplified value to the output stage, and wherein the gate driver includes:

a plurality of scan offset voltage sources configured to output a scan-off voltage to a corresponding scan line among the plurality of scan lines; and a plurality of scan transistors configured to be turned on or off in accordance with a scan signal transferred from the display controller, having one end connected to a plurality of LEDs and the other end grounded.

7. The LED display driving device of claim 6, wherein each of the master driver IC and the slave driver IC operates in a normal mode or a low power mode, wherein the normal mode includes a display period and a non-display period, and wherein when each of the master driver IC and the slave driver IC is driven in the normal mode, a plurality of channel current sources corresponding to the first and second channel line groups supply a channel current to a corresponding channel line in the display period and a plurality of scan transistors corresponding to the first and second scan line groups are turned on.

8. The LED display driving device of claim 6, wherein each of the master driver IC and the slave driver IC operates in a normal mode or a low power mode, wherein the normal mode includes a display period and a non-display period, and wherein when each of the master driver IC and the slave driver IC is driven in the normal mode, the scan-off voltage is greater than the channel-off voltage, and a plurality of channel-off voltage sources corresponding to the first and second channel line groups output the channel-off voltage to a corresponding channel line in the non-display period, and a plurality of scan offset voltage sources corresponding to the first and second scan line groups output the scan-off voltage to a corresponding scan line, so that a corresponding LED is maintained in a reverse voltage bias state.

9. The LED display driving device of claim 6, wherein, when an area in which data is 0 exists in the first and third display units based on the second direction, a plurality of channel current sources and a plurality of amplifiers, which correspond to an area in which data is 0 in the first channel line group, are blocked from a corresponding channel line, wherein a plurality of channel current sources corresponding to the second channel line group supply a channel current to a corresponding channel line, and wherein a plurality of scan transistors corresponding to the first and second scan line groups are turned on.

10. The LED display driving device of claim 6, wherein, when an area in which data is 0 exists in the second and fourth display units based on the second direction, a plurality of channel current sources and a plurality of amplifiers, which correspond to an area in which data is 0 in the second channel line group, are blocked from a corresponding channel line, a plurality of channel current sources corresponding to the first channel line group supply a channel current to a corresponding channel line, and a plurality of scan transistors corresponding to the first and second scan line groups are turned on.

11. The LED display driving device of claim 6, wherein, when all of the first to fourth display areas are areas in which data is 0, a plurality of channel current sources and a plurality of AMPs of the first and second channel line groups are blocked from a corresponding channel line, and wherein a plurality of scan offset voltage sources corresponding to the first and second scan line groups are connected to a plurality of LEDs corresponding thereto.

12. The LED display driving device of claim 6, wherein the data driver includes:

a plurality of first switches configured to be turned on or off in accordance with a pulse width modulation (PWM) signal transferred from the display controller, connecting the channel line to the channel current source; and a plurality of second switches configured to be turned on or off in accordance with a channel-off signal transferred from the display controller, connecting the channel line to the amplifier, and wherein the gate driver includes a plurality of third switches configured to be turned on or off in accordance with a scan signal transferred from the display controller, connecting the scan offset voltage source to the LED.

13. A light emitting diode (LED) display device comprising:

a display panel including a plurality of LEDs disposed in a plurality of subpixels where a plurality of channel lines and a plurality of scan lines intersect; and an LED display driving device configured to supply a channel current to the plurality of LEDs and allow the plurality of LEDs to emit light, wherein the LED display driving device includes:

a master driver integrated circuit (IC) and a slave driver IC configured to drive a plurality of LEDs arranged in each of a plurality of display areas included in a display panel, wherein the display area includes a plurality of display units, wherein the master driver IC drives a first scan line group corresponding to a first display unit and a second display unit adjacent to each other in a first direction among the plurality of display units and a first channel line group corresponding to the first display unit and a third display unit adjacent to each other in a second direction perpendicular to the first direction, and wherein the slave driver IC drives a second scan line group corresponding to the third display unit and a fourth display unit adjacent to each other in the first direction among the plurality of display units and a second channel line group corresponding to the second display unit and the fourth display unit adjacent to each other in the second direction.

14. The LED display device of claim 13, wherein the master driver IC is disposed in an area corresponding to the first display unit, and wherein the slave driver IC is disposed in an area corresponding to the fourth display unit.

15. The LED display device of claim 13, wherein each of the master driver IC and the slave driver IC includes:

a data driver configured to output a data signal corresponding to image data to a plurality of LEDs connected to each channel line through a plurality of channel lines extended in the second direction;

a gate driver configured to select an LED to emit light among the plurality of LEDs by outputting a scan signal synchronized with the data signal to a plurality of scan lines extended in the first direction; and a display controller configured to control the data driver and the gate driver.

16. The LED display device of claim 15, wherein each of the master driver IC and the slave driver IC further includes a synchronization unit configured to output a synchronization signal by a synchronization control signal output from the display controller, and wherein the scan signal of the master driver IC is synchronized with the scan signal of the slave driver IC based on the synchronization signal output from the master driver IC.

17. The LED display device of claim 15, wherein each of the master driver IC and the slave driver IC further includes:

an interface; and a power reduction determination unit configured to receive data from each interface, wherein a data input from an outside is transferred to the interface of the slave driver IC through the interface of the master driver IC, and wherein the power reduction determination unit of each of the master driver IC and the slave driver IC determines whether to operate in a low power mode or a normal mode through the data received from each interface.

18. The LED display device of claim 15, wherein the data driver includes:

a plurality of channel current sources configured to supply a channel current to a corresponding channel line among the plurality of channel lines;

a plurality of channel-off voltage sources configured to output a channel-off voltage to a corresponding channel line among the plurality of channel lines; and a plurality of amplifiers configured to amplify a difference between the channel-off voltage output from the channel-off voltage source and a voltage fed back from an output stage and output the amplified value to the output stage, and wherein the gate driver includes:

a plurality of scan offset voltage sources configured to output a scan-off voltage to a corresponding scan line among the plurality of scan lines; and a plurality of scan transistors configured to be turned on or off in accordance with a scan signal transferred from the display controller, having one end connected to a plurality of LEDs and the other end grounded.

19. The LED display device of claim 18, wherein each of the master driver IC and the slave driver IC operates in a normal mode or a low power mode, wherein the normal mode includes a display period and a non-display period, and wherein when each of the master driver IC and the slave driver IC is driven in the normal mode, a plurality of channel current sources corresponding to the first and second channel line groups supply a channel current to a corresponding channel line in the display period and a plurality of scan transistors corresponding to the first and second scan line groups are turned on.

20. The LED display device of claim 18, wherein each of the master driver IC and the slave driver IC operates in a normal mode or a low power mode, wherein the normal mode includes a display period and a non-display period, and wherein when each of the master driver IC and the slave driver IC is driven in the normal mode, the scan-off voltage is greater than the channel-off voltage, and a plurality of channel-off voltage sources corresponding to the first and second channel line groups output the channel-off voltage to a corresponding channel line in the non-display period, and a plurality of scan offset voltage sources corresponding to the first and second scan line groups output the scan-off voltage to a corresponding scan line, so that a corresponding LED is maintained in a reverse voltage bias state.

* * * * *